US009099500B2

(12) United States Patent
Huang et al.

(10) Patent No.: US 9,099,500 B2
(45) Date of Patent: Aug. 4, 2015

(54) PROGRAMMABLE ARRAY OF SILICON NANOWIRE FIELD EFFECT TRANSISTOR AND METHOD FOR FABRICATING THE SAME

(75) Inventors: Ru Huang, Beijing (CN); Jibin Zou, Beijing (CN); Runsheng Wang, Beijing (CN); Jiewen Fan, Beijing (CN); Changze Liu, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 243 days.

(21) Appl. No.: 13/503,240

(22) PCT Filed: Nov. 18, 2011

(86) PCT No.: PCT/CN2011/082465
§ 371 (c)(1),
(2), (4) Date: Oct. 18, 2012

(87) PCT Pub. No.: WO2012/139382
PCT Pub. Date: Oct. 18, 2012

(65) Prior Publication Data
US 2013/0075701 A1    Mar. 28, 2013

(30) Foreign Application Priority Data
Apr. 11, 2011    (CN) .......................... 2011 1 0089699

(51) Int. Cl.
*H01L 29/66* (2006.01)
*H01L 21/8238* (2006.01)
(Continued)

(52) U.S. Cl.
CPC ........... *H01L 29/66977* (2013.01); *B82Y 10/00* (2013.01); *H01L 21/823828* (2013.01);
(Continued)

(58) Field of Classification Search
USPC .......................................... 257/210, 390, 401
IPC ..................................... H01L 21/02603
See application file for complete search history.

(56) References Cited

U.S. PATENT DOCUMENTS 5,808,330 A * 9/1998 Rostoker et al. .............. 257/208
6,140,687 A * 10/2000 Shimomura et al. .......... 257/401
(Continued)

FOREIGN PATENT DOCUMENTS

| CN | 1823412 | 8/2006 |
|---|---|---|
| CN | 101060135 | 10/2007 |

(Continued)

OTHER PUBLICATIONS

International Search Report issued in International Application No. PCT/CN2011/082465, dated Mar. 8, 2012.
(Continued)

*Primary Examiner* — Eugene Lee
(74) *Attorney, Agent, or Firm* — DLA Piper LLP (US)

(57) ABSTRACT

The present invention discloses a hexagonal programmable array based on a silicon nanowire field effect transistor and a method for fabricating the same. The array includes a nanowire device, a nanowire device connection region and a gate connection region, wherein, the nanowire device has a cylinder shape, and includes a silicon nanowire channel, a gate dielectric layer, and a gate region, the nanowire channel being surrounded by the gate dielectric layer, and the gate dielectric layer being surrounded by the gate region; the nanowire devices are arranged in a hexagon shape to form programming unit, the nanowire device connection region is a connection node of three nanowire devices and secured to a silicon supporter. The present invention can achieve a complex control logic of interconnections and is suitable for a digital/analog and a mixed-signal circuit having a high integration degree and a high speed.

20 Claims, 5 Drawing Sheets

(51) Int. Cl.
*H01L 27/092* (2006.01)
*H01L 29/06* (2006.01)
*H01L 29/775* (2006.01)
*B82Y 10/00* (2011.01)
*H01L 21/02* (2006.01)
*B82Y 99/00* (2011.01)

(52) U.S. Cl.
CPC ...... *H01L21/823885* (2013.01); *H01L 27/092* (2013.01); *H01L 29/0673* (2013.01); *H01L 29/66439* (2013.01); *H01L 29/775* (2013.01); *B82Y 99/00* (2013.01); *H01L 21/02603* (2013.01)

(56) References Cited

U.S. PATENT DOCUMENTS

| | | | |
|---|---|---|---|
| 6,541,827 B1 * | 4/2003 | Takaishi | 257/390 |
| 6,709,929 B2 * | 3/2004 | Zhang et al. | 438/268 |
| 7,265,375 B2 | 9/2007 | Zhang | |
| 2005/0014385 A1 | 1/2005 | Ghozeil et al. | |
| 2008/0296557 A1 | 12/2008 | Kreupl | |
| 2011/0309237 A1 * | 12/2011 | Seo et al. | 250/208.2 |
| 2011/0315988 A1 * | 12/2011 | Yu et al. | 257/52 |
| 2012/0301953 A1 * | 11/2012 | Duan et al. | 435/287.9 |

FOREIGN PATENT DOCUMENTS

| | | |
|---|---|---|
| CN | 101295677 | 10/2008 |
| CN | 102184923 | 9/2011 |
| WO | WO 2010/099220 | 9/2010 |

OTHER PUBLICATIONS

Written Opinion issued in International Application No. PCT/CN2011/082465, dated Mar. 8, 2012.
English language abstract of CN 102184923, published Sep. 14, 2011.
English language abstract of CN 101060135, published Oct. 24, 2007.
English language abstract of CN 101295677, published Oct. 29, 2008.
English language abstract of CN 1823412, published Aug. 23, 2006.
Tamura, Takahiro et al., "Embedded Nanowire Network Growth and Node Device Fabrication for GaAs-Based High Density Hexagonal Binary Decision Diagram Quantum Circuits," Japanese Journal of Applied Physics, vol. 45, No. 4B, 2006, pp. 3614-3620.

* cited by examiner

PROGRAMMABLE ARRAY OF SILICON NANOWIRE FIELD EFFECT TRANSISTOR AND METHOD FOR FABRICATING THE SAME

CROSS REFERENCE TO RELATED APPLICATIONS

This application is a National Stage of International Application No. PCT/CN2011/082465, filed Nov. 18, 2011, which in turn, claims the benefit of Chinese Application No. CN 201110089699. X, filed Apr. 11, 2011, which are incorporated by reference in their entireties.

FIELD OF THE INVENTION

The invention relates to an ultra-large-scaled integrated circuit (ULSI) manufacturing technology, and particularly relates to a hexagonal programmable array of a silicon nanowire metal-oxide-silicon field effect transistor (SNW MOSFET) and a method for fabricating the same.

BACKGROUND OF THE INVENTION

The semiconductor device is an important element for producing an electronic product. The upgrading of the semiconductor device propels the development of the semiconductor technology and the progress of the semiconductor industry, especially improving the performance of the central processing unit (CPU) and memory. Starting from the end of last century, the chip fabrication process has been developed rapidly, and has entered the technology of less than 32 nm from a micrometer level.

As the feature size of the device entered the level of 45 nm or less, the gate control ability of the conventional planar transistor device is gradually reduced, and characteristics of the device are deteriorated and adversely affected by a short channel effect. In the design of the conventional device, the gate oxide layer has a thickness of several nanometers at most and even less than 1 nm. Such a thin gate oxide layer may cause a serious gate leakage current, so that the performance and reliability of the device are deteriorated, and the power consumption of the device is greatly increased. Meanwhile, if it is desired to reduce the junction depth by means of the process, how to achieve the process is faced with a huge challenge. On the other hand, since many thermal issues may be inevitably experienced during the whole fabrication process of the device, many difficulties may be brought into the fabrication of a shallow junction.

In order to solve a series of problems mentioned above, device designers have proposed a multi-gate device structure, such as a double-gate device, a triple-gate device and a surrounding-gate device to improve the gate control ability of the device. Among these, the surrounding-gate structure has the strongest gate control ability. Since the entire channel is surrounded by the gate, the nanowire structure in the surrounding-gate structure becomes the most potential device structure as the length of the channel is reduced to the nanometer scale. This is because the surrounding-gate structure is beneficial to improve the mobility and reliability of the device. Therefore, the nanowire device has become the most ideal device structure in the case that the feature size of the field effect transistor is reduced to the nanometer scale.

Furthermore, the Moore's Law points out that, the number of transistors included in an integrated circuit is to be doubled every 18 months, and the performance of the integrated circuit is also to be doubled. With the increasingly shrink of the feature size of the semiconductor device, a major factor for restricting the Moore's Law has been changed from the size of the operation region to other aspects such as the area of the source/drain, wirings, etc. In the conventional fabrication process of the nanowire, the source and the drain may occupy very large area, which is equivalent to an area twice larger than that of the effective operation region of the channel under the gate control. Undoubtedly, the above problem has become a very important factor for restricting further increase of the integration degree of the integrated circuit. Thus, how to save the areas and optimize the layout design of the silicon nanowire device have already become a subject in current design of the integrated circuit with high integration density.

SUMMARY OF THE INVENTION

An object of the embodiment of the present invention is to fill a gap in the prior art. Directed to the conventional process, herein is provided an optimal fabrication solution based on a nanowire transistor. In the invention, a hexagon programmable array is formed to greatly increase the integration degree of the nanowire device, facilitate the programming, and achieve an ultra-large-scaled digital/analog and mixed-signal circuit having an ultra high integration degree.

A technical solution of the embodiment of present invention is as follows.

A hexagonal programmable array of a silicon nanowire field effect transistor (as shown in FIG. 1), includes a nanowire device, a nanowire device connection region and a gate connection region; the nanowire devices are arranged in a hexagon shape to form programming units, a common nanowire device is shared by adjacent programming units and a central portion of each of the programming units is a hollow region; the nanowire device (see FIG. 2) is a core potion of the hexagonal programmable array of the silicon nanowire field effect transistor, and has a cylinder structure. The nanowire device includes a silicon nanowire channel, a gate dielectric layer and a gate region. The gate dielectric layer surrounds the silicon nanowire channel, and the gate region surrounds the gate dielectric layer. The silicon nanowire channel, the gate dielectric layer and the gate region have an identical length, which is in a range of 5 nm-1 µm.

The silicon nanowire channel has a diameter in a range of 3 nm-100 nm. The silicon nanowire channel has a doping concentration of less than $10^{15}$ cm$^{-3}$, or is undoped or equivalent to being undoped.

The gate dielectric layer has a thickness in a range of 0.5 nm-10 nm.

The gate region has a thickness in a range of 10 nm-500 nm.

The nanowire device is connected with the nanowire device connection region, and each of the nanowire device connection regions is connected with three nanowire devices, so that interconnections between a plurality of nanowire devices with a high density is achieved. Since the nanowire device connection region are on both sides of the nanowire device, the nanowire device connection region may be used as a source or a drain of the nanowire device at the same time. In practice, the source and the drain may be specifically defined by a user. Meanwhile, there is a silicon supporter under the nanowire device connection region to support the entire network of the nanowire devices. The nanowire device connection region has a size depending on a size/process condition of the nanowire channel, and a dimensional scale is shown in FIGS. 1 and 2. For, a circuit structure including both an N-type and a P-type nanowire device in a CMOS process, the nanowire device connection region has a doping concentration of less than $10^{15}$ cm$^{-3}$, or is undoped or equivalent to be undoped. For a separated NMOS or PMOS process in which all of the devices have an identical type. The nanowire device connection region may be heavily doped with a doping concentration of $10^{18}$-$10^{20}$ cm$^{-3}$.

The gate connection region provides a connection for the gate region of the nanowire device, so that a plurality of nanowire devices may form a gate-sharing structure.

In an embodiment of the present invention, a method for fabricating the hexagonal programmable array of the silicon nanowire field effect transistor is based on a known technology for fabricating a nanowire. Under the CMOS process, the method includes the following steps:

(1) selecting a silicon wafer having a very low doping concentration (less than 1015cm−3), and defining a hollow region of the silicon wafer with a hard mask;

(2) removing the hard mask in the step (1), slimming a silicon nanowire bar by oxidation to form a floated network of silicon nanowires, wherein, the nanowire device connection region formed by the interlaced masks is thicker than the nanowire channel; and in the process of slimming by oxidation, the nanowire may be floated, while the nanowire device connection region is not floated; under the nanowire device connection region there is a silicon supporter supporting the entire network;

(3) performing a wet etching process to remove a formed silicon dioxide, and performing a thermal oxidation process to form a densified silicon dioxide gate dielectric layer;

(4) defining an N-type gate connection and a P-type gate connection by using other two hard masks, wherein they may be defined by a user and controlled by programming;

(5) depositing material to form a gate connection region; and (6) defining a pattern, of an isolation section by using another mask to isolate portions undesired to be connected; isolating the connection of these portions by using the etching technology, which may be controlled by programming; (this step is optional, and may be skipped if the isolation is not required)

(7) performing finally a subsequent conventional CMOS process.

Under a NMOS or PMOS process, the following modifications are required.

In the step (4), only one mask for the gate is used.

In the step (5), after forming the gate connection region, one mask is required to be added additionally, so that the hexagonal programmable array is heavily doped with a doping concentration of $10^{18}$-$10^{20}$ cm$^{-3}$. Subsequently, a rapid thermal annealing (RTA) process is performed to drive impurities into the nanowire device connection region and other nanowire channel used as an interconnection line.

It is to be noted that, for the CMOS process and the NMOS/PMOS process, the nanowire channel used as interconnection line in the former is required to be fabricated with a gate control to achieve a purpose of equivalent to a transmission gate. Meanwhile, the nanowire channel used as an interconnection line in the latter is not required to be fabricated with a gate control, where it is only required to implant impurities of high concentration. Thus, the step (4) under the CMOS process and the step (4) under the NMOS/PMOS process may be different.

As compared with the conventional technology, an effect of the embodiments of the present invention is described below.

The hexagonal programmable array of the silicon nanowire field effect transistor is suitable for a digital/analog and a mixed-signal circuit with a high integration degree and a high speed. Since a large source/drain contact of the conventional nanowire device is not formed, the area is saved. As compared with the conventional filed programmable gate array FPGA of the conventional planar transistor, the present invention can suppress a short channel effect while saving large areas greatly, so that an ultra high degree of integration may be achieved. Meanwhile, each interconnection node (the nanowire device connection region) of the hexagonal nanowire network is connected with three device channel. There are three devices between the most remoted two nodes in each unit, so that a complex control logic, for controlling interconnections is achieved, which is not able to be provided by the conventional array.

BRIEF DESCRIPTION OF THE DRAWINGS

FIG. 1(a) is a schematic plan view of a hexagonal programmable array of a silicon nanowire field effect transistor in an embodiment of the present invention, in which:

Figure 1A:
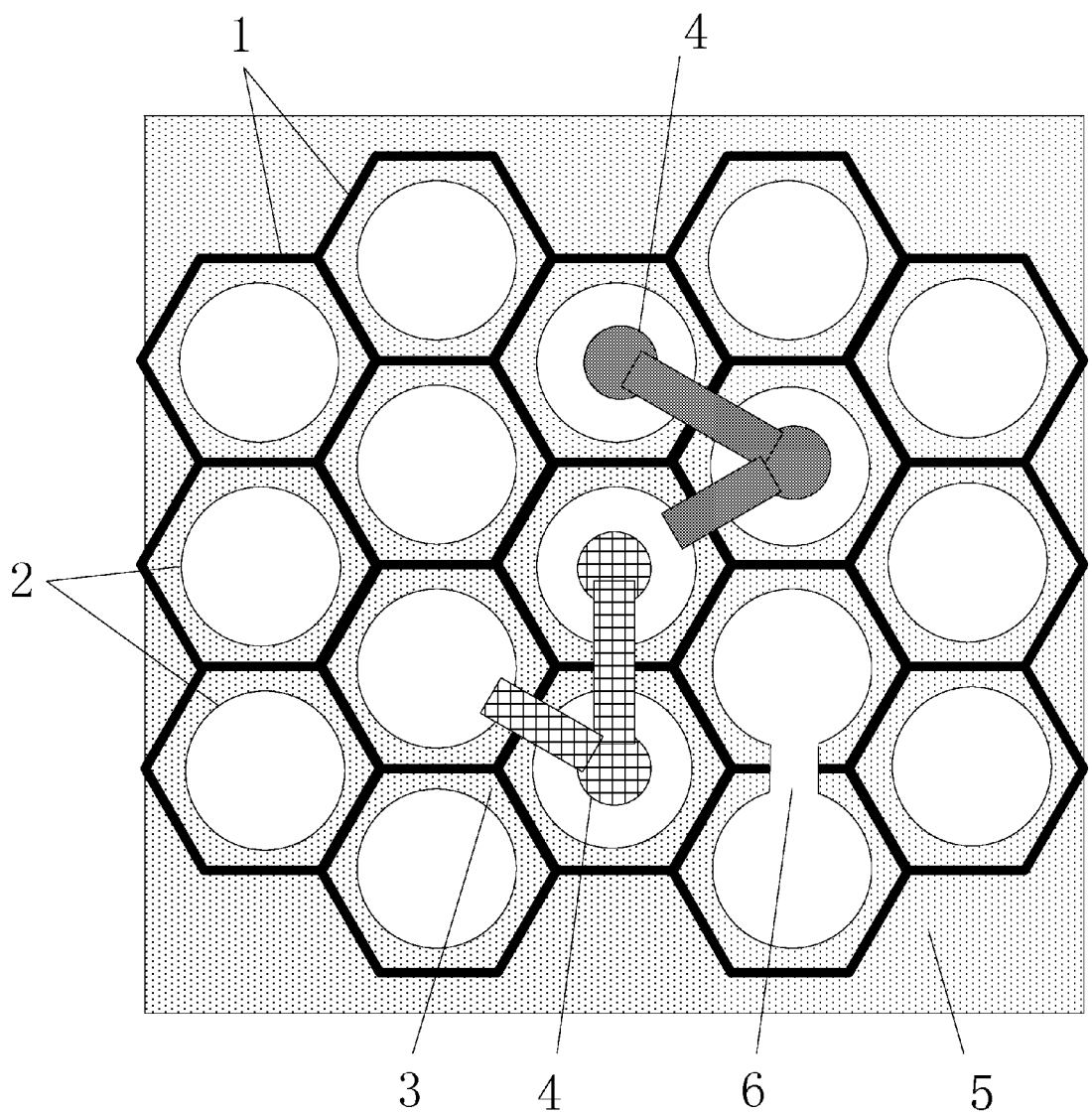
Figure 1B:
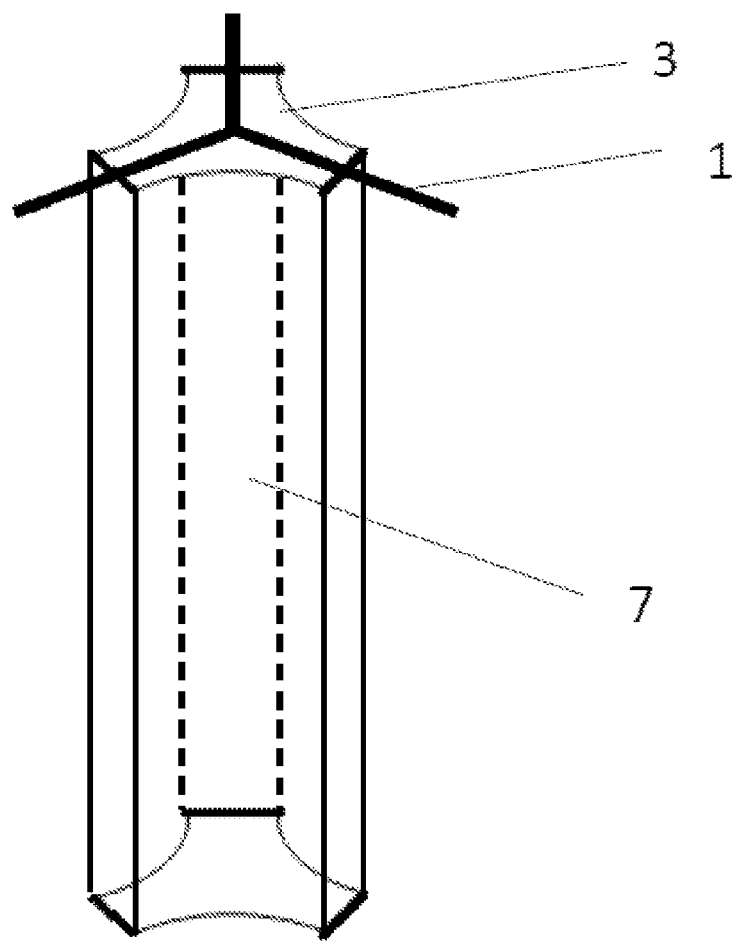
Figure 2:
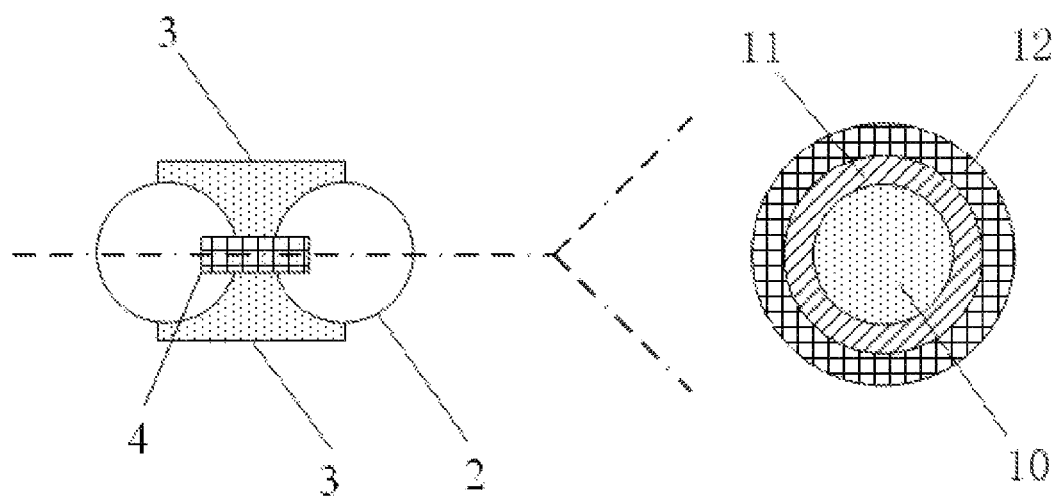
Figure 3:
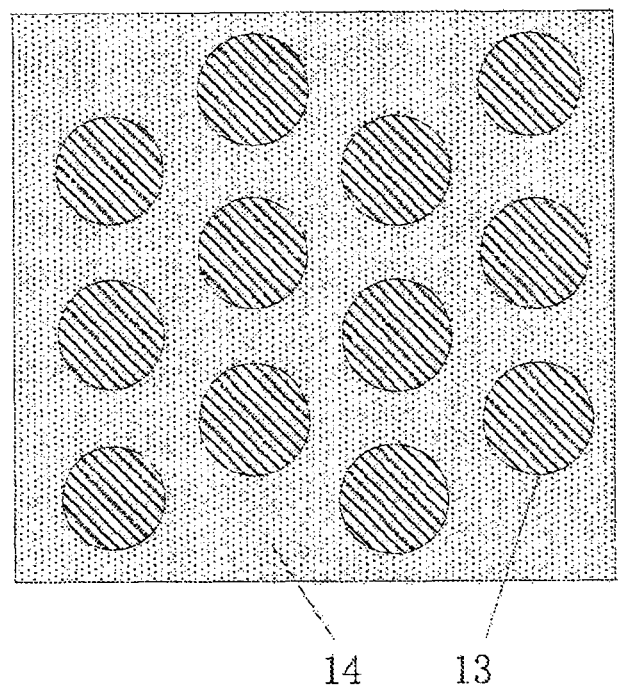
Figure 4:
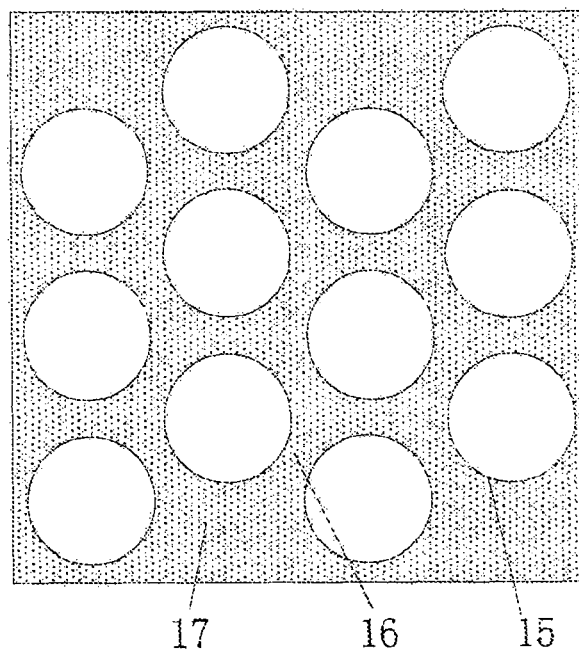
Figure 5:
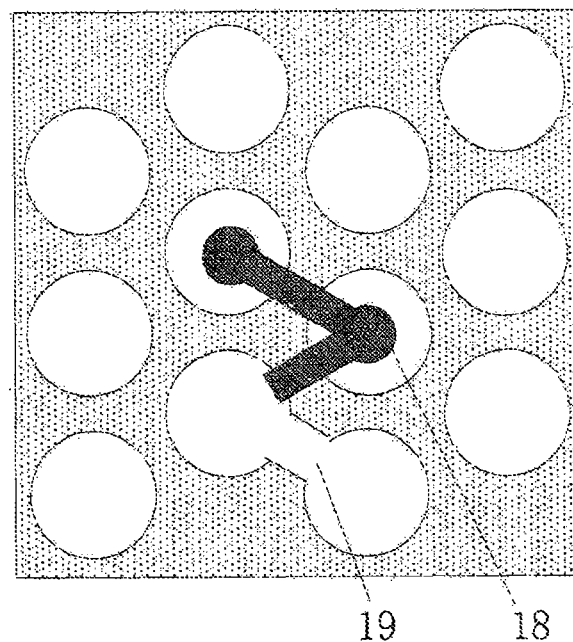

1—a conceptual stick diagram of a nanowire device, 2—a hollow region of a silicon wafer, 3—a nanowire device connection region, 4—a gate connection region (in this drawing, there may be two types of gate made of two types of material to achieve an NMOS and a PMOS), 5—a silicon wafer, 6—an isolation section;

FIG. 1(b) is a schematic perspective view of a nanowire device connection region and a silicon supporter underneath the nanowire device connection for supporting the network, in which:

1—a nanowire device; 3—a nanowire device connection region; 7—a silicon supporter underneath the nanowier device connection;

FIG. 2 shows on its left side a schematic diagram of a single nanowire device,in which:

3—a nanowire device connection region, 2—a hollow region of a silicon wafer, 4—a gate region of a nanowire device;

FIG. 2 shows on its right side a cross-section diagram of a single nanowire device, In which:

10—a silicon nanowire channel,11—a gate dielectric layer,12—A gate region;

FIG. 3 shows a first hard mask which is circular or square (in this drawing a circular is taken as an example. However, if a square is used, a pattern can be exposed in a circular shape by using the proximity effect of exposure), in which:

13—a circular mask, 14—a silicon wafer;

FIG. 4 shows that a circular pattern is formed by etching after exposure; and a nanowire silicon bar is slimmed by oxidation, so as to be floated while forming a cross section in a circular shape as shown on the right side of FIG. 2, in which:

15—a hollow region of a silicon wafer, 16—a nanowire channel, 17—a silicon wafer;

FIG. 5 shows that a gate connection region is formed by deposition after forming a gate dielectric layer by high temperature oxidation, wherein a portion covering over a nanowire channel is the gate region, and then an isolation section may be defined to isolate a certain undesired connection.

18—a gate connection region, 19—an isolation section.

Figure 6:
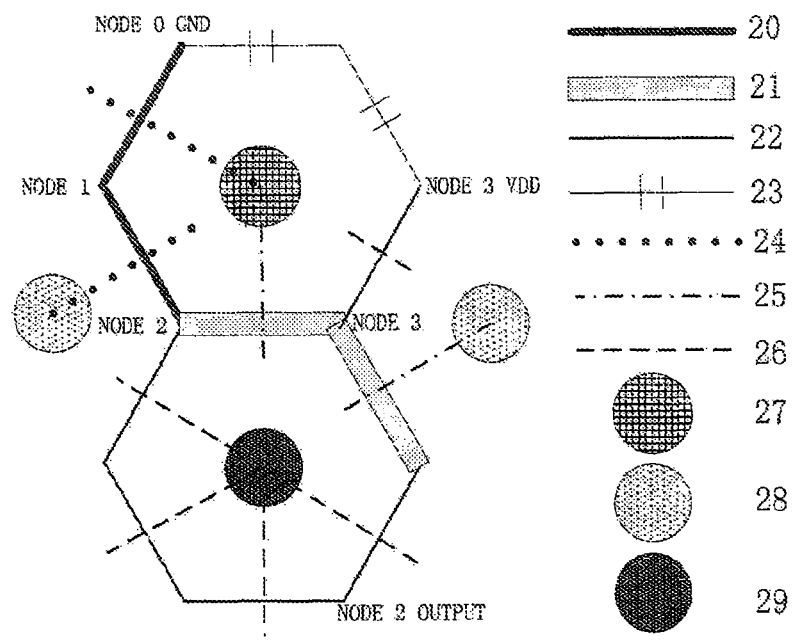
Figure 7:
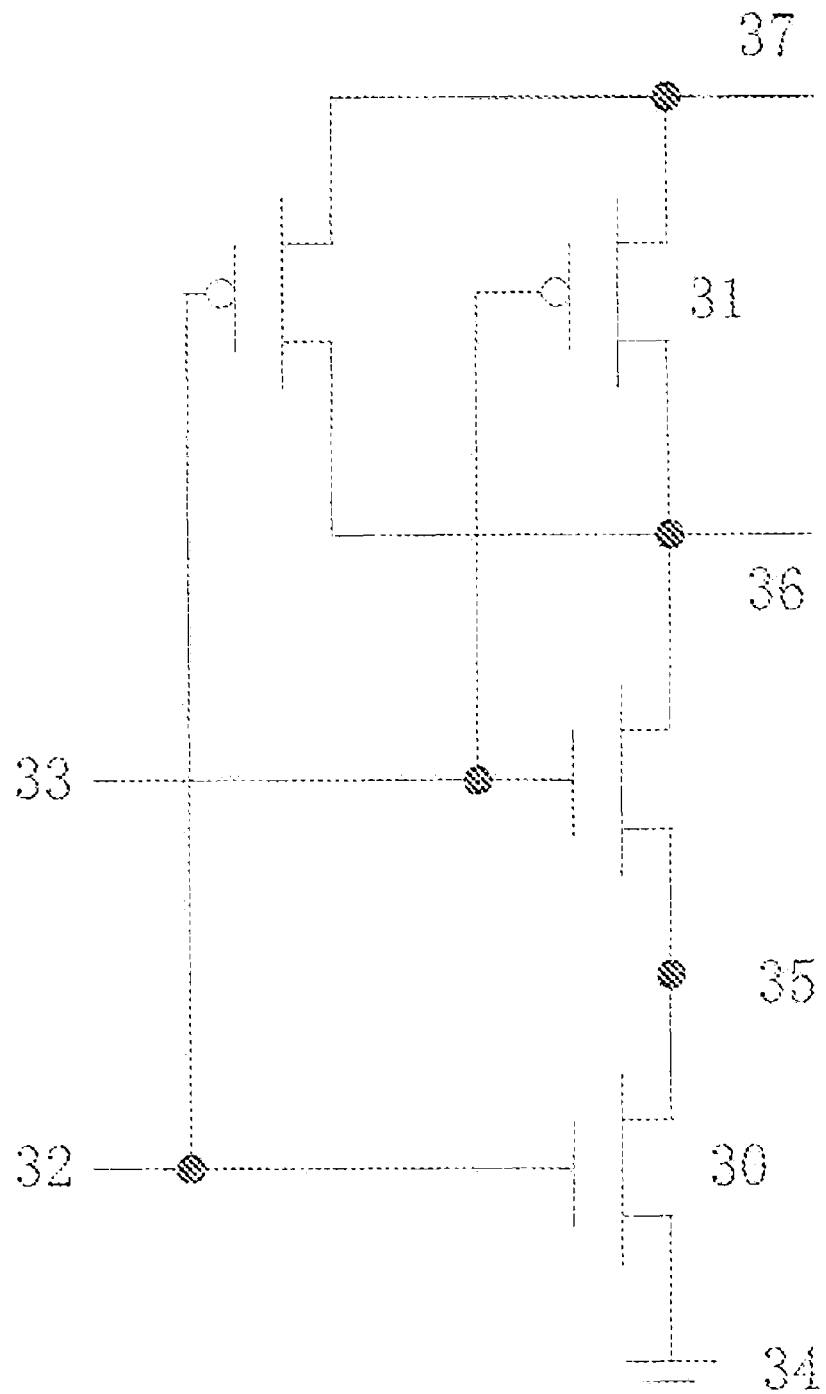

FIG. 6 is a schematic diagram of a CMOS NAND gate including 4 transistors by using two basic hexagonal units, in which:

20—an N type nanowire device, 21—a P type nanowire device, 22—a normally-open transistor used as an interconnection, 23—an isolated nanowire, 24—a gate of an N type nanowire device, 25—a gate of a P type nanowire device, 26—a gate of a normally-open transistor (equivalent to a transmission gate), 27—an input signal A, 28—an input signal B, 29—an input of normally-open transistor (VDD or GND, depending on the type of the normally-open transistor); and FIG. 7 is a circuit diagram of a CMOS NAND gate corresponding to various devices and signals in FIG. 6, in which: 30—an N type nanowire device, 31—a P type nanowire device, 32—an input signal A, 33—an input signal B, 34—a node 0 GND, 35—a node 1, 36—a node 2 output, 37—a node 3 VDD.

DETAILED DESCRIPTION OF THE EMBODIMENTS

Hereinafter, a further description of the present invention will be given in detail through drawings and specific embodiments.

FIG. 1 is a schematic plan view of a hexagonal programmable array of a silicon nanowire field effect transistor in an embodiment of the present invention. The silicon nanowire field effect transistor and a general nanowire field effect transistor differ in terms of the structure as follows.

Firstly, the structure of the nanowire device is changed. The conventional nanowire device generally includes: a nanowire channel, a gate region, a source region and a drain region. In order to form an interconnection wiring through the via, the source region and the drain region of the conventional nanowire device occupy a very large area. The nanowire device in the hexagonal array provided in the present invention discards the conventional source/drain. Instead, they are replaced with a nanowire device connection region having a small area and that can be used as an interconnection node, so that the redundant area between channels of nanowire devices is greatly reduced. For circuit structures having the identical function, the core area can be saved by at least eight ninths. Moreover, an interlaced circular mask also makes possible a formation of such network of the nanowire devices. The nanowire device connection region formed by the interlaced masks is thicker than a nanowire channel. In a process step of slimming by oxidation, the nanowire channel may be floated, while the nanowire device connection region is not floated by controlling process conditions, including a suitable oxidation temperature such as 950° C. and a suitable time such as 10s. The nanowire device connection region has a silicon supporter underneath for supporting the entire network.

Secondly, the hexagonal programmable array of the silicon nanowire field effect transistor has a simple process, in which the hollow region of the silicon wafer is defined only one time to form many nanowires. It is equivalent to achieving three nanowire devices by using one photolithography pattern, and thus the photolithography technology is effectively used. This is especially obvious when the electron beam lithography process is used.

Meanwhile, each interconnection node (the nanowire device connection region) of the hexagonal networks of the nanowire devices is connected with three device channels. There are three devices between the most remoted two nodes in each unit, so that a complex control logic for controlling the interconnection can be achieved, which is not able to be provided by the conventional array. The above differences are beneficial to improve the performance and the operation efficiency of the nanowire field effect transistor. Thus, the hexagonal programmable array of the silicon nanowire field effect transistor is suitable for the digital/analog and the mixed-signal circuit having a high integration degree and a high speed.

Hereinafter, the main fabrication flow is described by taking a case in which a NAND gate is fabricated with a hexagonal programmable array of the silicon nanowire field effect transistor under the CMOS process.

(1) A silicon wafer with a doping concentration of less than $10^{15}$ cm$^{-3}$ is selected, and a hollow region of the silicon wafer is defined by using an interlaced hard mask, as shown in FIG. 3. In this step, the area of the interlaced pattern is less than that of the expected hollow region of the silicon wafer, and may have a circular, a square or a hexagonal shape. The purpose for forming a larger circular shape is achieved by the proximity effect during exposure. The typical area of a basic unit of the interlaced pattern is in the range from 10 nm×10 nm to 2.5 μm×2.5 μm.

(2) The hard mask in the step (1) is removed, and the nanowire silicon bar is slimmed by oxidation to form the network of the floated silicon nanowires. The nanowire device connection region formed by the interlaced hard mask is thicker than the nanowire channel. In the process step of oxidation slimming, the nanowire channel may be floated, while the nanowire device connection region is not floated. The nanowire device has the silicon as the supporter underneath for supporting the entire network.

(3) A formed silicon dioxide is removed by wet etching, and a densified silicon dioxide gate dielectric layer is formed by a thermal oxidation process, as shown in FIG. 7 (at this time the silicon has a silicon dioxide layer covered thereon all over, which is not shown)

(4) An N type gate connection and a P type gate connection are respectively defined by other two hard masks, so that gates are defined and meanwhile types of the devices covered by the gates are also defined. Then, a nanowire device gate connection region is formed by deposition. In this step, the N type gate and the P type gate use different materials. If an NMOS is to be formed, the N type gate is implanted by phosphorus P/Arsenic As; and if a PMOS is to be formed, the P type gate is implanted by boron B.

(5) Some patterns of isolation sections are defined by using another mask to isolate some portions undesired to be connected. The connection between these portions are isolated by the etching technology.

Subsequent processes are the same as those in the conventional CMOS process. A planarization process, a deposition process for an isolation layer, a photolithography process for a peripheral input/output wire hole, a deposition process for a metal, a photolithography process for a wire, a passivation process and etc. are sequentially performed.

FIG. 6 shows an embodiment including two hexagonal programming units, in which nine nanowire devices are used. Among the nine nanowire devices, there are two N type nanowire devices and two P type nanowire devices, and other five nanowire devices are used as interconnections. Referring to FIG. 7, an N type nanowire device 29 and a P type nanowire device 30 are respectively controlled by a gate 33 of the N type nanowire device and a gate 34 of the P type nanowire device, where threshold voltages are controlled by work function difference between the gate of different materials and the silicon to achieve the purpose of forming different types of nanowire devices.

The hexagonal programmable array of the silicon nanowire field effect transistor is described by the above specific examples. The application occasions and embodiments described above do not limit the present invention. Various changes and modifications can be made by those skilled in the art without departing from the spirit or scope of the invention. Thus, the protection scope of the present invention depends on the scope of appended claims.

What is claimed is:

1. A hexagonal programmable array based on a silicon nanowire field effect transistor, the hexagonal programmable array comprising:
 a nanowire device having a nanowire device connection region and a gate connection region, the nanowire device connection region being defined where three nanowire devices are connected;
 wherein the nanowire device has a floated cylinder shape and includes a silicon nanowire channel, a gate dielectric layer and a gate layer, the entire silicon nanowire channel being surrounded by the gate dielectric layer, and the gate dielectric layer being surrounded by the gate layer, wherein the silicon nanowire channel, the gate dielectric layer and the gate layer have an identical length, which is in a range of 5 nm-1 μm;
 wherein the nanowire devices are arranged in hexagon structures to form programming units each corresponding to one hexagon structure, a common nanowire device is shared by adjacent programming units, and a central portion of each of the programming units is a hollow region;
 wherein the nanowire device connection region is connected to the silicon nanowire channel while being used as a source or a drain of the nanowire device;
 wherein the nanowire device connection region is secured to a silicon supporter underneath the nanowire device connection region; and
 wherein a connection for the gate layers of the plurality of nanowire devices is provided by the gate connection region, so that the plurality of nanowire devices form a gate-sharing structure.

2. The hexagonal programmable array based on the silicon nanowire field effect transistor according to claim 1, wherein the silicon nanowire channel has a diameter in a range of 3 nm-100 nm and has a doping concentration of less than $10^{15}$ cm$^{-3}$, or is undoped or equivalent to being undoped.

3. The hexagonal programmable array based on the silicon nanowire field effect transistor according to claim 1, wherein the gate dielectric layer has a thickness in a range of 0.5 nm-10 nm.

4. The hexagonal programmable array based on the silicon nanowire field effect transistor according to claim 1, wherein the gate layer has a thickness in a range of 10 nm-500 nm.

5. The hexagonal programmable array based on the silicon nanowire field effect transistor according to claim 2, wherein the gate dielectric layer has a thickness in a range of 0.5 nm-10 nm.

6. The hexagonal programmable array based on the silicon nanowire field effect transistor according to claim 5, wherein the gate layer has a thickness in a range of 10 nm-500 nm.

7. The hexagonal programmable array based on the silicon nanowire field effect transistor according to claim 2, wherein the gate layer has a thickness in a range of 10 nm-500 nm.

8. The hexagonal programmable array based on the silicon nanowire field effect transistor according to claim 2, wherein the silicon nanowire channel has a diameter in a range of 3 nm-100 nm.

9. The hexagonal programmable array based on the silicon nanowire field effect transistor according to claim 8, wherein the gate dielectric layer has a thickness in a range of 0.5 nm-10 nm.

10. The hexagonal programmable array based on the silicon nanowire field effect transistor according to claim 9, wherein the gate layer has a thickness in a range of 10 nm-500 nm.

11. The hexagonal programmable array based on the silicon nanowire field effect transistor according to claim 8, wherein the gate layer has a thickness in a range of 10 nm-500 nm.

12. The hexagonal programmable array based on the silicon nanowire field effect transistor according to claim 2, wherein the silicon nanowire channel has a doping concentration of less than $10^{15}$ cm$^{-3}$, or is undoped or equivalent to being undoped.

13. The hexagonal programmable array based on the silicon nanowire field effect transistor according to claim 12, wherein the gate dielectric layer has a thickness in a range of 0.5 nm-10 nm.

14. The hexagonal programmable array based on the silicon nanowire field effect transistor according to claim 13, wherein the gate layer has a thickness in a range of 10 nm-500 nm.

15. The hexagonal programmable array based on the silicon nanowire field effect transistor according to claim 12, wherein the gate layer has a thickness in a range of 10 nm-500 nm.

16. The hexagonal programmable array based on the silicon nanowire field effect transistor according to claim 1, wherein the hollow region is defined only one time.

17. The hexagonal programmable array based on the silicon nanowire field effect transistor according to claim 1, wherein the nanowire channel is floated and the nanowire device connection region is not floated.

18. The hexagonal programmable array based on the silicon nanowire field effect transistor according to claim 1, formed by a CMOS process.

19. The hexagonal programmable array based on the silicon nanowire field effect transistor according to claim 1, wherein the hexagonal programmable array suppresses a short channel effect.

20. The hexagonal programmable array based on the silicon nanowire field effect transistor according to claim 1, wherein the hexagonal programmable array increases the integration degree of the nanowire device to achieve an ultra-large-scale digital-analog mixed-signal circuit.

* * * * *